United States Patent
Chen (12) United States Patent (10) Patent No.: US 7,305,513 B2
Chen (45) Date of Patent: Dec. 4, 2007

(54) CIRCUIT FOR PREVENTING NONVOLATILE MEMORY FROM OVER-ERASE

(75) Inventor: Chung Zen Chen, Hsinchu (TW)

(73) Assignee: Elite Semiconductor Memory Technology, Inc. (TW)

( * ) Notice: Subject to any disclaimer, the term of this patent is extended or adjusted under 35 U.S.C. 154(b) by 372 days.

(21) Appl. No.: 10/940,987

(22) Filed: Sep. 14, 2004

(65) Prior Publication Data

US 2005/0216652 A1  Sep. 29, 2005

(30) Foreign Application Priority Data

Mar. 25, 2004  (TW) .............. 93108184 A (51) Int. Cl.
*G06F 12/00* (2006.01)
*G11C 16/14* (2006.01)

(52) U.S. Cl. .............. 711/103; 365/185.2; 365/185.22; 365/185.24; 365/185.29; 365/185.3; 365/185.33

(58) Field of Classification Search .............. 711/103; 365/185.2, 185.22, 185.24, 185.29, 185.3, 365/185.33

See application file for complete search history.

(56) References Cited

U.S. PATENT DOCUMENTS

| 4,875,188 | A |   | 10/1989 | Jungroth |
| 5,142,495 | A | * | 8/1992 | Canepa .............. 365/185.2 |
| 5,414,664 | A |   | 5/1995 | Lin et al. |
| 5,544,116 | A |   | 8/1996 | Chao et al. |
| 5,642,311 | A |   | 6/1997 | Cleveland et al. |
| 5,708,602 | A | * | 1/1998 | Yamada .............. 365/185.2 |
| 5,729,492 | A | * | 3/1998 | Campardo .......... 365/185.21 |
| 5,831,905 | A | * | 11/1998 | Hirano .............. 365/185.29 |
| 5,856,945 | A |   | 1/1999 | Lee et al. |
| 5,870,335 | A | * | 2/1999 | Khan et al. .......... 365/185.18 |
| 5,966,330 | A | * | 10/1999 | Tang et al. .......... 365/185.2 |
| 5,986,940 | A | * | 11/1999 | Atsumi et al. ........ 365/185.3 |
| 6,052,310 | A | * | 4/2000 | Sunkavalli .......... 365/185.29 |
| 6,157,572 | A |   | 12/2000 | Haddad et al. |
| 6,172,915 | B1 |   | 1/2001 | Tang et al. |
| 6,185,133 | B1 | * | 2/2001 | Chan et al. .......... 365/185.29 |
| 6,188,609 | B1 |   | 2/2001 | Sunkavalli et al. |
| 6,285,588 | B1 | * | 9/2001 | Fastow .............. 365/185.19 |
| 6,285,599 | B1 |   | 9/2001 | Shimada et al. |
| 6,314,027 | B1 |   | 11/2001 | Choi |
| 6,381,670 | B1 | * | 4/2002 | Lee et al. .............. 711/103 |

(Continued)

OTHER PUBLICATIONS

Shin et al., "A study of electrical characteristics and reliability on flash EEPROM cell", Jun. 27-Jul. 1, 2000, IEEE, The 4th Korea-Russia International Symposium on Science and Technology, vol. 2, pp. 228-233.*

*Primary Examiner*—Sanjiv Shah
*Assistant Examiner*—A. P. Savla
(74) *Attorney, Agent, or Firm*—Hoffman & Baron, LLP (57) ABSTRACT

A method for preventing the over-erase in a nonvolatile memory comprises the following steps. First, at least one normal cell of the nonvolatile memory and at least one reference cell that corresponds to the at least one normal cell are provided with a constant current. Second, the erasing threshold voltage of the at least one normal cell is determined, and then the at least one normal cell is erased to be of the erasing threshold voltage. By virtue of adding the constant current, the higher erasing threshold voltage can be acquired, and in consequence over-erase can be avoided.

6 Claims, 7 Drawing Sheets

U.S. PATENT DOCUMENTS

| | | | |
|---|---|---|---|
| 6,421,277 B2 * | 7/2002 | Tsunesada | 365/185.3 |
| 6,442,074 B1 * | 8/2002 | Hamilton et al. | 365/185.29 |
| 6,449,190 B1 * | 9/2002 | Bill | 365/185.2 |
| 6,490,203 B1 * | 12/2002 | Tang | 365/185.22 |
| 6,493,266 B1 * | 12/2002 | Yachareni et al. | 365/185.22 |
| 6,529,413 B2 | 3/2003 | Lee et al. | |
| 6,559,710 B2 * | 5/2003 | Matsuoka | 327/537 |
| 6,563,737 B2 * | 5/2003 | Khouri et al. | 365/185.21 |
| 6,563,741 B2 * | 5/2003 | Mihnea et al. | 365/185.29 |
| 6,567,316 B1 * | 5/2003 | Ohba et al. | 365/185.3 |
| 6,580,643 B1 * | 6/2003 | Satoh et al. | 365/185.22 |
| 6,714,459 B2 * | 3/2004 | Hirano | 365/185.3 |
| 6,930,928 B2 * | 8/2005 | Liu et al. | 365/185.29 |
| 7,020,021 B1 * | 3/2006 | Leung et al. | 365/185.19 |
| 7,239,553 B2 * | 7/2007 | Suitou et al. | 365/185.22 |

* cited by examiner

CIRCUIT FOR PREVENTING NONVOLATILE MEMORY FROM OVER-ERASE

CROSS-REFERENCE TO RELATED APPLICATION

This application claims priority based on Taiwan Patent Application No. 093108184 filed on Mar. 25, 2004, which is incorporated herein by reference.

BACKGROUND OF THE INVENTION (A) Field of the Invention

The present invention is related to a circuit and a method for preventing over-erase of memory, which are specifically applied to a nonvolatile memory.

(B) Description of the Related Art

Nonvolatile memory, especially NOR flash memory, often suffers the problem of over-erase. In general, a chip is made up of cell arrays connected to each other by means of a plurality of wordlines and bitlines arranged in rows and columns. For example, a bitline links the drains of 512 cells. The erasing of a cell is accompanied by that of the other cells. In a situation where cells at a certain address are not fully erased, erasing will take place continuously and repeatedly unless and until it is done. As a result, cells which are readily erased may be over-erased. The cells can cause leakage current to the bitlines they belong to, if over-erased, and in consequence an accumulation of excessive leakage current leads to a faulty reading, writing or over-erase correction. For instance, the state of programmed cells is mistaken for the state of erased cells, or excessive supplying current is needed during programming and over-erase correction. These problems are particularly serious in an environment where the supplying current is low or the temperature is high. Normal cells have their erasing verification compared with erasing reference cells in order to be erased, their programming verification compared with programming reference cells in order to be programmed, and their reading verification compared with reading reference cells in order to be read. There can be only one reference cell whose wordline voltage is set to different verification-dependent values in order to supply different reference cell currents for the sake of comparison.

Generally, every nonvolatile memory cell comprises a control gate and a floating gate. If the capacitance of the tunnel oxide layer of the cell is denoted by Cox and the dielectric layer such as ONO, that is, a multi-layer composed of an oxide layer, a nitride layer and an oxide layer, between the floating gate and the control gate is denoted by $C_{ONO}$, then the coupling factor is expressed as $C_{ONO}/(C_{ONO}+C_{OX})$. The higher the coupling factor is, the greater the proportion of the voltage applied to the control gate coupled to the floating gate is.

Figure 1:
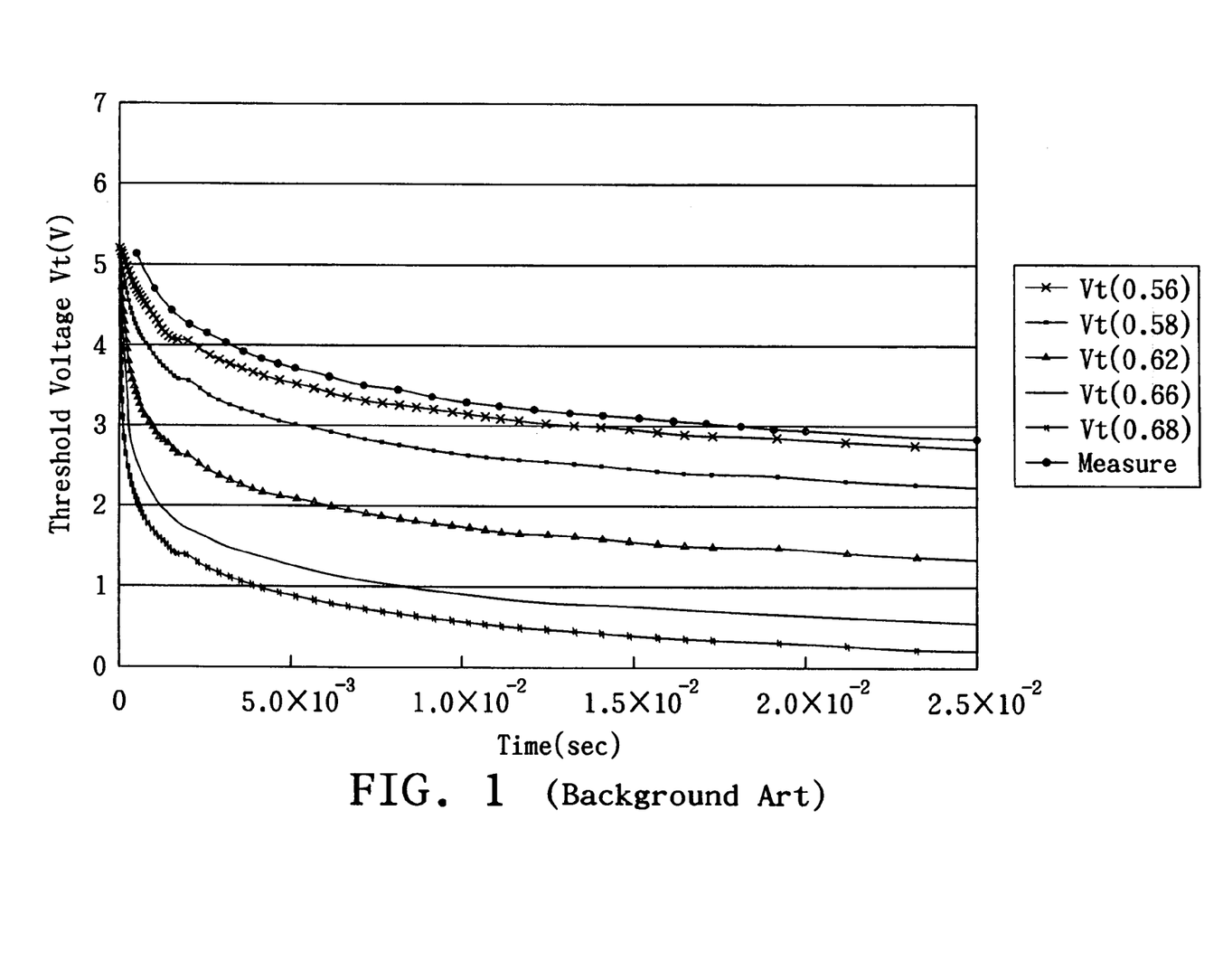
FIGS. 1 through 3 illustrate the problem of over-erase for a conventional nonvolatile memory.

FIG. 1 shows the relationship between the threshold voltage Vt for erasing cells of different coupling factors and time, wherein the numerical value in the bracket behind Vt refers to a coupling factor. The higher a coupling factor is, the more efficient the voltage coupled to a floating gate is, so its corresponding threshold voltage Vt drops faster. For instance, when the threshold voltage of a cell with a coupling factor of 0.56 is erased to about 3V, the threshold voltage of a cell having the coupling factor of 0.68 is already decreased to 0.4V. Therefore, the cell with the coupling factor of 0.68 is very likely to generate leakage current due to the low threshold voltage or contribute a punch-through between the source and the drain. The aforesaid current leakage problem is quite common, because the coupling factor of each cell varies and it depends on the cell structure design and the manufacturing processing of the chips.

Figure 2:
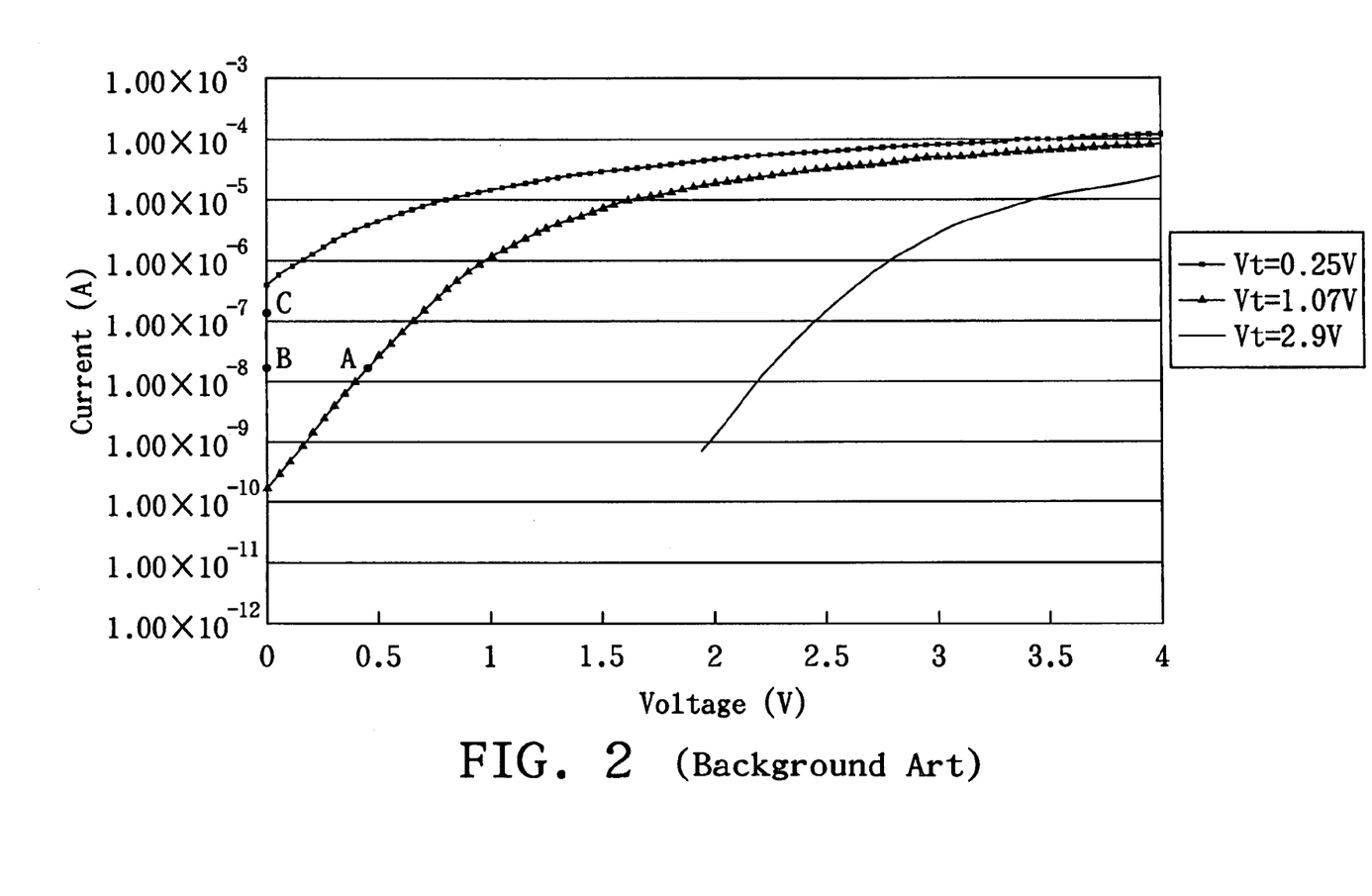
Figure 3:
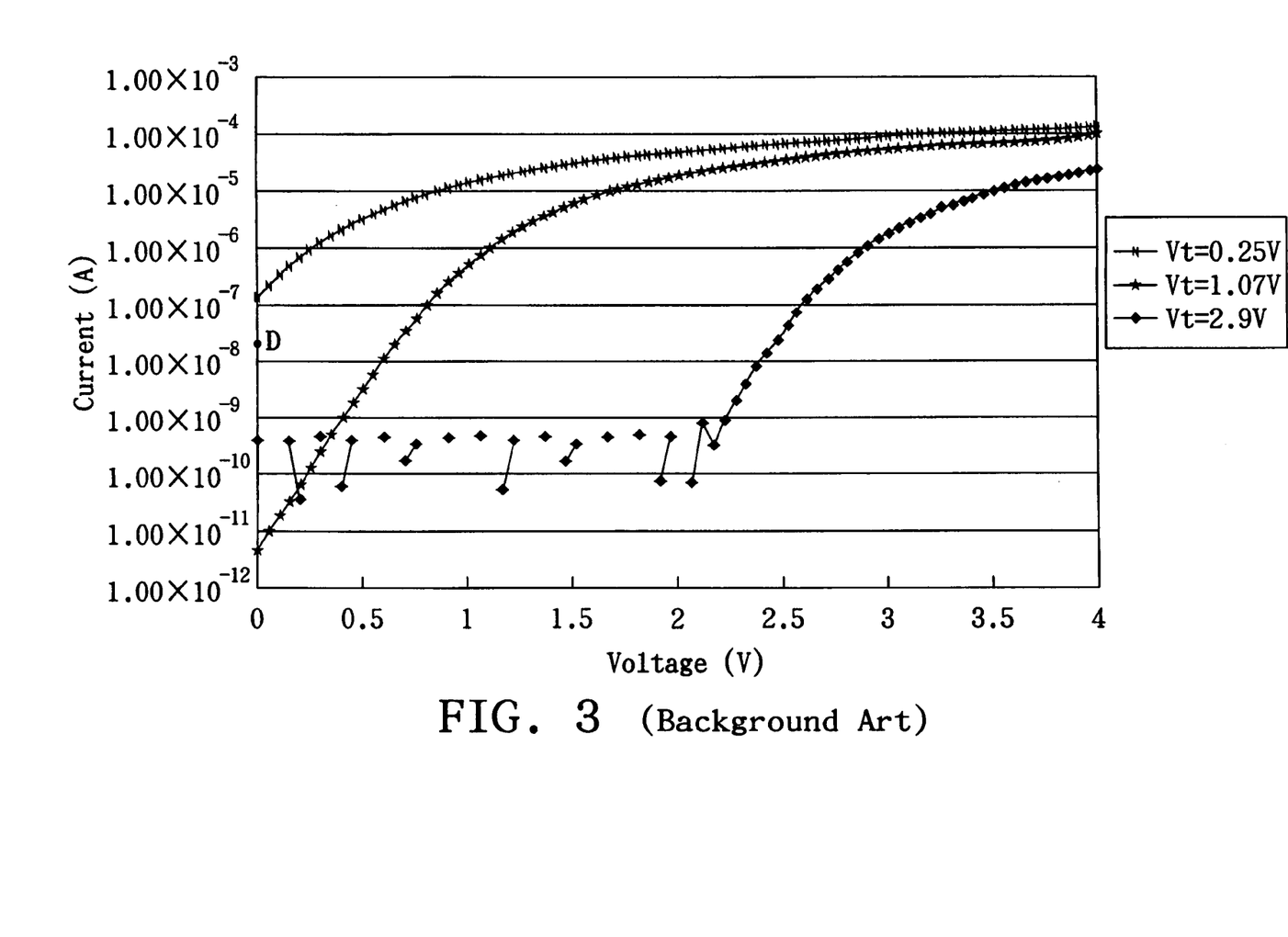

FIGS. 2 and 3 are diagrams depicting the current vs. voltage characteristics of a single cell at temperatures of 85° C. and 25° C., respectively. The abscissa plots control gate voltage, whereas the ordinate plots current flowing from the drain to the source. In addition, a voltage of 1V is applied to the drain, and the source is grounded.

Referring to FIG. 2, three curves are plotted under different threshold voltages, namely 0.25V, 1.07V and 2.9V respectively. And these Vt are defined at 25° C. If Vt is 1.07V and wordline voltage is 0.45V, which is what happens at point A, the cell creates a current of approximately 20 nA. If point A is transversely shifted to point B, which is under a zero voltage, and the 20 nA current remains unchanged, Vt, which corresponds to point B, becomes approximately 0.62V. As a result, if a cell has a threshold voltage of 0.62V, even though zero voltage is applied to a wordline, a leakage current of around 20 nA is still generated. Consequently, in the case of a bitline comprising 512 bits, i.e., comprising 512 cells, the bitline will create a leakage current of approximately 10 μA (20 nA×512).

Referring to FIG. 3, under the circumstance of 25° C., point D, which similarly contributes a 20 nA leakage current in the cell, has a corresponding threshold voltage of approximately 0.42V. Referring to FIG. 2 again, in the case of the threshold voltage of 0.42V and under the circumstance of 85° C., which is what happens at point C, the corresponding leakage current is approximately 116 nA, and therefore the whole bit line accounts for a leakage current of 58 μA. A summary of the aforesaid findings is found in Table 1.

TABLE 1

| Vt at 25° C. | Temperature | Wordline Voltage | Current | Bitline Leakage Current (512 cells) |
|---|---|---|---|---|
| 1.07 V | 85° C. | 0.45 V | 20 nA | 10 μA |
| 0.62 V | 85° C. | 0 V | 20 nA | 10 μA |
| 0.42 V | 25° C. | 0 V | 20 nA | 10 μA |
| 0.42 V | 85° C. | 0 V | 116 nA | 58 μA |

This shows that, even if erase operations are smoothly carried out on cells that are hard to be erased at low temperature, it is likely that leakage current increases at high temperature and causes a false reading. Threshold voltage Vt depends on the design of cells as well as the consideration given to varying degrees of reliability and speed. At present, prevention of over-erase is mostly achieved by improving erase algorithms, but over-erase may occur in the presence of a faulty erase algorithm.

U.S. Pat. No. 6,157,572, No. 6,285,599, No. 6,172,915, No. 5,414,664, No. 5,856,945, No. 6,529,413, No. 6,314,027, No. 6,188,609, No. 5,642,311, No. 6,567,316, No. 6,490,203, No. 5,544,116 and No. 4,875,188 disclose methods for preventing the over-erase of nonvolatile memory. However, they fail to solve the over-erase problem which arises because a coupling factor varies from process deviation.

SUMMARY OF THE INVENTIION

An objective of the present invention is to provide a circuit and a method for preventing the over-erase of non-} volatile memory and thereby increase erasing threshold voltage, so as to avoid erroneous cell status judgment caused by over-erase.

To achieve the above objective, the present invention discloses a method for preventing the over-erase of a nonvolatile memory. The method comprises the following steps. First, at least one normal cell of the nonvolatile memory and at least one reference cell that corresponds to the at least one normal cell are provided with a constant current. Second, the erasing threshold voltage of the at least one normal cell is determined, and then the at least one normal cell is erased to be of the erasing threshold voltage. By virtue of adding the constant current, the higher erasing threshold voltage can be acquired, and in consequence over-erase can be avoided.

Moreover, it is feasible to properly determine the programming threshold voltage for the at least one normal cell and the reading threshold voltage for the at least one reference cell, so as to accurately verify whether the at least one normal cell is under erased or programmed status.

In general, the constant current is set to a value between 7 μA and 15 μA, so as to increase the erasing threshold voltage by about 0.3-0.5V.

The aforesaid method may be implemented by the circuit described below. The circuit comprises a normal cell circuit, a reference cell circuit, a sense amplifier and a constant current source. The normal cell circuit, comprising a normal cell and a first bit switch, is employed to record the erased or programmed status of the nonvolatile memory, whereas the reference cell circuit, comprising a reference cell and a second bit switch, is employed to read the erased or programmed status of the nonvolatile memory. The ON/OFF status of the second bit switch is identical to that of the first bit switch. The first and second bit switches are intended for selection of bitlines. The sense amplifier receives and compares outputs from the normal cell circuit and reference cell circuit to judge whether the nonvolatile memory is under erased or programmed status.

Different reference cells can be used in erasing verification, programming verification and reading; and the cells have different Vt to distinguish these three states. Besides, different wordline voltages provide different currents for various verifications so that the reference cell can be compared with the normal cell. The constant current source supplies a constant current to the normal cell and the reference cell, and the input points are respectively positioned between the first bit switch and the sense amplifier as well as between the second bit switch and the sense amplifier. The constant current source generates the constant current in accordance with the mirror principle, and works in a saturation region to avoid being subject to variation in temperature.

DETAILED DESCRIPTION OF THE PREFERRED EMBODIMENTS

Figure 4:
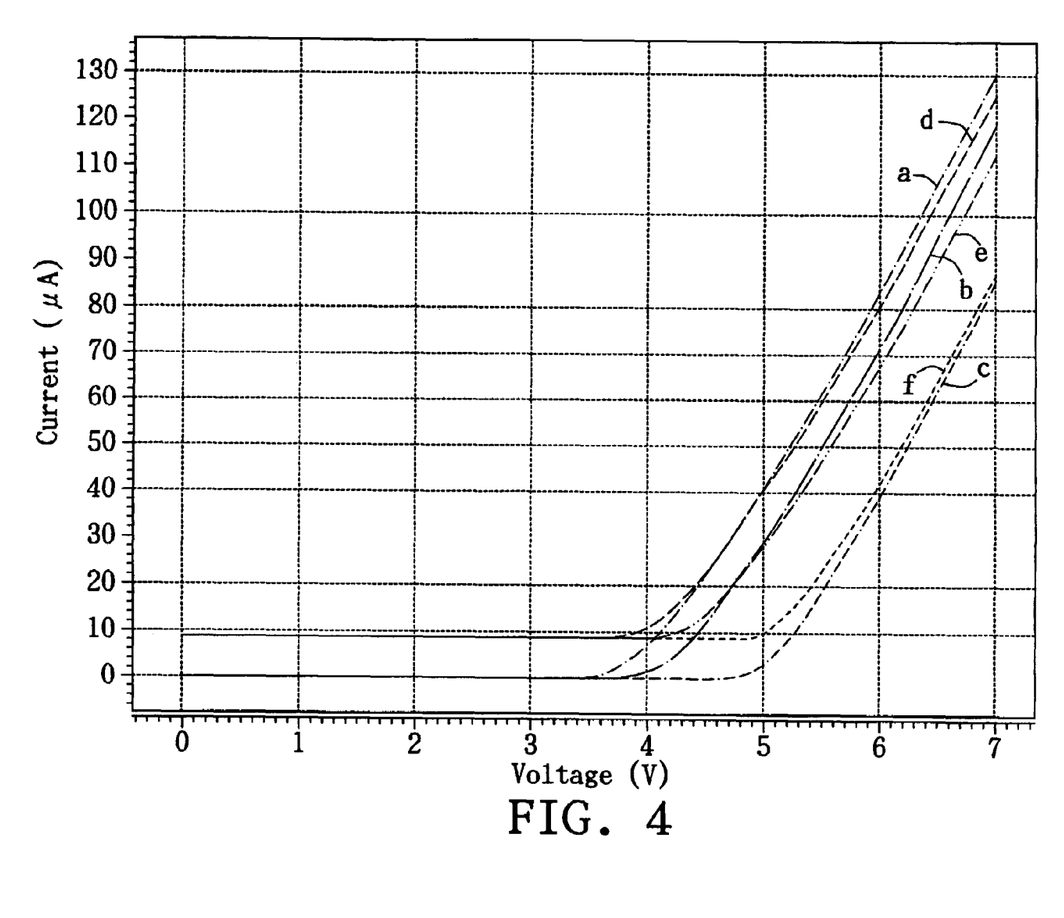
FIGS. 4 and 5 illustrate the operation principles for preventing over-erase in a nonvolatile memory in accordance with the present invention.
Figure 5:
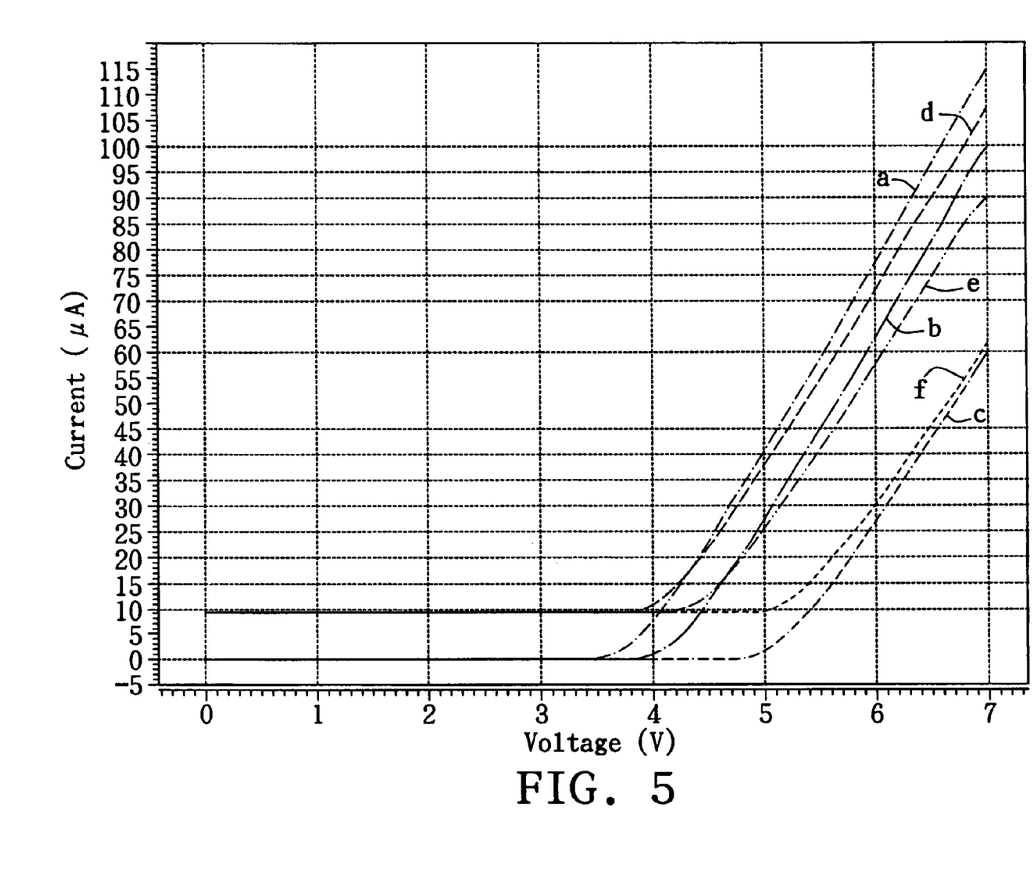

FIGS. 4 and 5 show the characteristic curves of voltage vs. current for a cell at 90° C. and 0° C., respectively. Referring to FIG. 4, the curves "a", "b" and "c" having three Vt at 25° C., namely 3.46V, 3.86V and 4.76V, are intended for an erasing reference cell, a reading reference cell and a programming reference cell, respectively. If Vt of a normal cell is erased to be less than 3.46V (curve "a"), which is equivalent to the Vt of the erasing reference cell, the wordline has a voltage of 4.4V and the corresponding drain current is equal to 20 μA. If a voltage of 4.4V is applied to the wordline of the reference cell (curve "b") intended for reading, the corresponding drain current is 10 μA. If a normal cell in a programmed status has a threshold voltage Vt greater than 4.76V, as denoted by the curve "c," illustrating the Vt for programming the reference cell, and the wordline has a voltage of 4.4V also, the corresponding bitline current is equal to 0 μA. Hence, the current difference between a normal cell in a programmed status and in an erasing status is approximately 20 μA. For reading a normal programmed cell, even though the rest of the cells on the same bitline have a total leakage current of less than 10 μA, i.e., a leakage current allowance of 20 nA per cell, a programmed status can still be identified correctly because the read reference cell supplies a current of 10 μA. The allowed leakage current for reading is calculated by subtracting the current of the reference cell in a programmed status from the current of the reference cell intended for reading. The leakage current allowance increases from 10 μA to 20 μA in a situation where the wordline voltage increases to 4.7V in the presence of an erasing reference cell current of 30 μA, a reading reference cell current of 20 μA, and a programming reference cell current is 0 μA. Given this, without any applied wordline voltage, the erasing threshold voltage for a normal cell can be reduced by 0.1 V. For instance, Vt can be decreased from aforesaid 0.62V to 0.52V without leading to a false reading but, in other words, taking fault tolerance of around 0.1V. The relationship between reference cell current and wordline voltage is summarized and shown in Table 2. In practice, wordline voltage is commonly increased by 0.2 to 0.4V in order to lessen over-erase.

TABLE 2

|  | Vt at 25° C. | Wordline Voltage | Temperature | Current |
| --- | --- | --- | --- | --- |
| Erasing reference cell | 3.46 V | 4.4 V | 90° C. | 20 μA |
| Reading reference cell | 3.86 V | 4.4 V | 90° C. | 10 μA |
| Programming reference cell | 4.76 V | 4.4 V | 90° C. | 0 μA |
| Erasing reference cell | 3.46 V | 4.7 V | 90° C. | 30 μA |
| Reading reference cell | 3.86 V | 4.7 V | 90° C. | 20 μA |
| Programming reference cell | 4.76 V | 4.7 V | 90° C. | 0 μA |

Generally, to prevent the problem of over-erase, the erasing threshold voltage Vt should not be too low and is preferably greater than 0.7V at 25° C. An optimal Vt still depends on the design of cells, and a chip may end up with a false reading at high temperature even though it passes a low-temperature test.

Assuming threshold voltages Vt for a reference cell to be erased, read and programmed at 25° C. are 3.86V, 4.24V and 5.0V, respectively, and a constant current of 10 μA is added, the voltage and current relations are illustrated with curves "d", "e" and "f" respectively, wherein the curve "d" matches the curve "a" roughly, the curve "e" matches the curve "b" roughly, the curve "f" matches the curve "c" roughly, except that the starting currents are different. Accordingly, if the constant current is supplied to the normal cell also, the erasing threshold voltage Vt will be increased by 0.4V while the same bitline current is still being kept. Consequently, it is not necessary to erase the cell to be of an extremely low voltage, so that the probability of over-erase occurrence can be greatly reduced. Table 3 shows the aforesaid findings. In practice, the constant current is generally between 7 µA and 15 µA in order to increase the erasing threshold voltage by 0.3 to 0.5V.

TABLE 3

|  | Vt at 25° C. | Wordline Voltage | Temperature | Current |
|---|---|---|---|---|
| Erasing reference cell | 3.86 V | 4.7 V | 90° C. | 30 µA |
| Reading reference cell | 4.24 V | 4.7 V | 90° C. | 20 µA |
| Programming reference cell | 5.00 V | 4.7 V | 90° C. | 10 µA |

According to the present invention, a constant current is added to cell current during reading, i.e., state verification, without changing the total current of the bitline significantly, to increase the erasing threshold voltage. Hence, the cell needs not to be erased to be of a relatively low voltage, so that over-erase can be avoided. The constant current is unlikely to vary with temperature. Since the constant current may also increase the leakage current of the bitline, the constant current may also have to be supplied to the reference cell intended for reading and state verification lest a false reading occurs later.

FIG. 5 shows the characteristics curves of voltage vs. current at 0° C., which are similar to that of FIG. 4 and therefore is not explained herein.

To increase the threshold voltage Vt of a normal cell in an erasing status for preventing over-erase, it is necessary to supply the normal cell with a constant current to make the cell have a higher threshold voltage Vt whenever erasing verification is performed by a sense amplifier. Such a constant current may also be supplied to an erased reference cell, so as to obtain better minimum wordline voltage level limit. As shown in FIG. 4, in a situation where Vt of the erasing reference cell is 3.46V (curve "a"), whereas the normal cell has a Vt of 3.86V (curve "d") and a constant current of 10 µA, if the wordline voltage level is 4V, the current of the normal cell is 3 µA greater than that of the reference cell at 90° C. For this reason, the reference cell may even be identified to be in an erasing status even if the Vt of the normal cell is slightly greater than 3.86V. In view of the objective making the Vt of the cell less than 3.86V, it is suggested that a constant current should be supplied to both the normal cell and the erase reference cell.

For reading, the normal cell may also make use of such a constant current. A comparison between the situation where the constant current is not used and the situation where the constant current is supplied indicates that it is necessary to increase the voltage level of the wordline in order to supply the reading current or the target current intended for the sense amplifier. For reading a normal cell having a Vt of 5V and being in a programmed status, the current of the normal cell (curve "f") is compared with that of the reading reference cell (curve "e" with the addition of the constant current, or curve "b" without any addition of the constant current). If the wordline voltage is less than 4.4V, the current of the reading reference cell as described by curve "b" is less than that of the normal cell in a programmed status as described by curve "f." Under such circumstance, the cell in a programmed status is mistaken for in an erasing status when the cell is read. However, if a constant current is supplied to the reference cell (curve "e"), an appropriate limit of the programmed status can be acquired for verifying the status of the cell.

The constant current may be applied to the normal cell, the reading reference cell and the erasing reference cell to follow up reading operations and erasing verification.

Programming verification works well regardless of whether the constant current is supplied or not. Nevertheless, it is suggested that the constant current should be supplied in order to trace cell current.

Figure 6A:
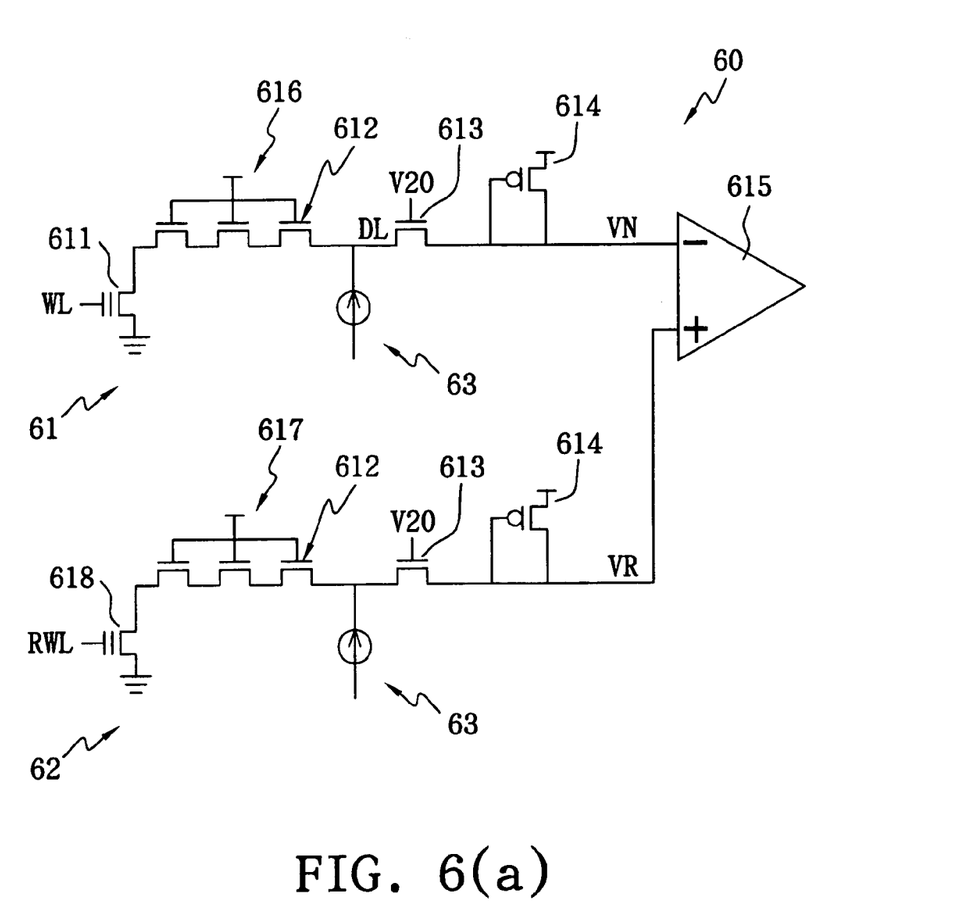
FIGS. 6(a), 6(b) and 7 show exemplary circuits for preventing over-erase in a nonvolatile memory in accordance with the present invention.

FIG. 6(a) is a diagram illustrating a circuit 60 for preventing over-erase in a nonvolatile memory of an embodiment in accordance with the present invention, wherein it essentially comprises a normal cell circuit 61 and a reference cell circuit 62. The normal cell circuit 61 comprises a normal cell 611, pass transistors 612, a first transistor 613 and a second transistor 614. The structure of the circuit of the reference cell circuit 62 is similar to that of the normal cell circuit 61 except that the normal cell 611 is replaced with the reference cell 618. For erasing verification, programming verification and reading, various reference cells having different Vt or different wordline voltages RWL can be used. To select bitlines, the pass transistors 612 in the normal cell circuit 61 forms a first bit switch 616, whereas the pass transistors 612 in the reference cell circuit 62 forms a second bit switch 617. The ON/OFF status of the first bit switch 616 is identical to that of the second bit switch 617. To solve the problem of over-erase by increasing the aforesaid threshold voltage Vt, a constant current source 63 is introduced between the pass transistors 612 and first transistor 613 of the normal cell circuit 61, and so is the reference cell circuit 62. The output voltages VN and VR of the normal cell circuit 61 and the reference cell circuit 62 are transmitted to a sense amplifier 615 for comparison in order to verify the status of the normal cell 611, whereas each sense amplifier 615 is equipped with at least one constant current source. The first transistor 613, whose voltage V20 is of 2V approximately, is intended to prevent the bitline of drain from being programmed.

Figure 6B:
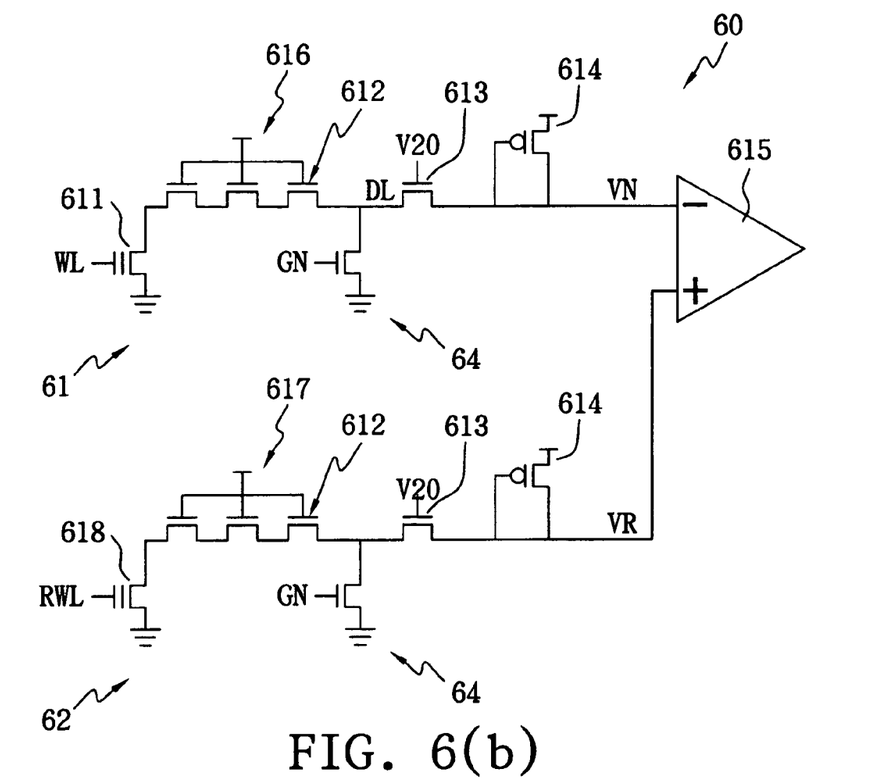

FIG. 6(b) is a diagram showing a circuit substantially identical to the circuit shown in FIG. 6(a), except that the constant current source 63 is implemented by an MOS transistor 64.

Figure 7:
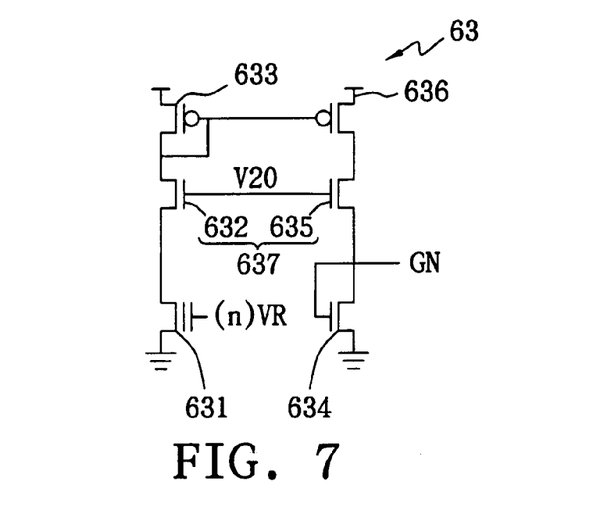

FIG. 7 illustrates another embodiment of the constant current source 63 created in accordance with the mirror principle. The constant current source 63 comprises a flash cell 631, an NMOS transistor 632, a PMOS transistor 633, and transistors 634, 635 and 636 which mirror the aforesaid components. The gate voltage of the flash cell 631 can be a reference voltage VR or any of its multiples nVR. The mirror transistor group 637 composed of NMOS transistors 632 and 635 uses the same voltage V20 that is applied to the first transistor 613 in FIG. 6(a). The gate GN of the transistor 634 corresponds, and is connected, to the gate of the transistor 64. The threshold voltage Vt for erasing and programming as well as the constant current are adjustable in accordance with the design of the constant current source 63 of the present embodiment. In addition, the flash cell 631 has to operate in a saturation region, i.e., current does not vary with the voltage between the drain and the source, and the flash cell is also kept away from a sub-threshold region, and in consequence the effect of variation in temperature is lessened. The flash cell 631 can be replaced by an NMOS transistor also, but in consequence it is difficult to adjust the magnitude of the constant current.

The method for preventing the over-erase of a nonvolatile memory in accordance with the present invention can be applied to most erasing algorithms, thereby efficiently preventing the problem of over-erase.

The above-described embodiments of the present invention are intended to be illustrative only. Numerous alternative embodiments may be devised by those skilled in the art without departing from the scope of the following claims.

What is claimed is:

1. A circuit for preventing over-erase in a nonvolatile memory, comprising:
    a normal cell circuit including a normal cell and a first bit switch for recording an erasing verification of the nonvolatile memory;
    a reference cell circuit including a reference cell and a second bit switch for verifying an erasing status of the nonvolatile memory;
    a sense amplifier which receives and compares outputs of the normal cell circuit and the reference cell circuit, so as to verify the erasing or programming state of the normal cell;
    a constant current source for providing a constant current to the normal cell during an erase operation of the normal cell, thereby preventing over-erase, wherein the constant current is positioned between the first bit switch and the sense amplifier; and
    wherein the first bit switch is positioned between the normal cell and the sense amplifier, and the second bit switch is positioned between the reference cell and the sense amplifier.

2. The circuit for preventing over-erase in a nonvolatile memory in accordance with claim 1, wherein each of the normal cell circuit and the reference cell circuit further comprises a first transistor, wherein the first transistor of the normal cell circuit is positioned between the first bit switch and the sense amplifier, and the first transistor of the reference cell circuit is positioned between the second bit switch and the sense amplifier.

3. The circuit for preventing over-erase in a nonvolatile memory in accordance with claim 1, wherein the constant current source generates the constant current in light of a mirror principle.

4. The circuit for preventing over-erase in a nonvolatile memory in accordance with claim 1, wherein the constant current source comprises a flash cell, an NMOS, a PMOS and transistors that mirror to the flash cell, NMOS and PMOS.

5. The circuit for preventing over-erase in a nonvolatile memory in accordance with claim 2, wherein the constant current source comprises a mirror transistor group whose gate voltage is the same as the gate voltage of the first transistor.

6. The circuit for preventing over-erase in a nonvolatile memory in accordance with claim 1, wherein the reference cell is added with a constant current.

* * * * *